(12) United States Patent
Wu

(10) Patent No.: US 7,042,547 B2
(45) Date of Patent: May 9, 2006

(54) METHOD OF REPAIRING PIT DEFECT AND SALIENT DEFECT OF ELECTRODE PATTERN

(75) Inventor: Yi-Jen Wu, Tao-Yuan Hsien (TW)

(73) Assignee: AU Optronics Corp., Hsin-Chu (TW)

( * ) Notice: Subject to any disclaimer, the term of this patent is extended or adjusted under 35 U.S.C. 154(b) by 120 days.

(21) Appl. No.: 10/707,560

(22) Filed: Dec. 22, 2003

(65) Prior Publication Data

US 2004/0227897 A1 Nov. 18, 2004

(30) Foreign Application Priority Data

May 15, 2003 (TW) .............................. 92113211 A

(51) Int. Cl.
*G02F 1/1337* (2006.01)
*G02F 1/133* (2006.01)
(52) U.S. Cl. ........................................ 349/192; 349/32
(58) Field of Classification Search ................... 349/32, 349/192; 345/60–63, 73; 313/582, 586
See application file for complete search history.

(56) References Cited

U.S. PATENT DOCUMENTS

| 6,479,120 | B1 * | 11/2002 | Miyaji | 428/46 |
| 6,856,305 | B1 * | 2/2005 | Nagano | 345/60 |
| 6,870,371 | B1 * | 3/2005 | Park et al. | 324/403 |

FOREIGN PATENT DOCUMENTS

| JP | 10297128 | | 11/1998 |
| JP | 11-25853 | * | 1/1999 |
| JP | 2000-068629 | * | 3/2000 |
| JP | 2000-348623 | * | 12/2000 |
| JP | 2001-107101 | * | 4/2001 |

* cited by examiner

*Primary Examiner*—Tarifur R. Chowdhury
(74) *Attorney, Agent, or Firm*—Winston Hsu

(57) ABSTRACT

An inspection process is performed to determine defects of an electrode pattern. A first repairing process is performed to fill the pit part, and a second repairing process is performed to remove the salient part. The first repairing process utilizes a conductive paste to fill the pit part of the electrodes, and the second repairing process utilizes a laser beam to remove the salient part of the electrode pattern so that the electrodes can discharge normally.

9 Claims, 5 Drawing Sheets

METHOD OF REPAIRING PIT DEFECT AND SALIENT DEFECT OF ELECTRODE PATTERN

BACKGROUND OF INVENTION

1. Field of the Invention

The present invention relates to a method of repairing electrode pattern defects, and more particularly, to a method of repairing electrode pattern defects with a conductive paste and a laser beam.

2. Description of the Prior Art

As the requirements and applications of flat panel displays grow, the plasma display panel (PDP) gains more and more potential because of its small size, large display area, and wide view angle.

The plasma display panel substantially comprises a front substrate, a back substrate, a discharge gas filled between the front substrate and the back substrate for generating ultraviolet lights, and a plurality of parallel sustain electrodes positioned on the surface of the front substrate for discharging electricity. The front substrate further comprises a plurality of bus electrodes respectively connected to each sustain electrode. The back substrate further comprises a plurality of address electrodes vertical to the sustain electrodes, a plurality of ribs parallel to the address electrodes, and a fluorescent layer coated on the address electrodes and the ribs. Each two neighboring ribs and two corresponding sustain electrodes thereon form a discharge cell for generating lights.

Generally speaking, the plasma display panel includes hundred thousands of discharge cells, and each discharge cell is hundreds of micrometers in length. While an initial voltage is applied to the sustain electrodes, the discharge gas located between the front substrate and the back substrate will be discharged to generate ultraviolet lights. Then while the ultraviolet light irradiates different fluorescent layers, the discharge cells will generate red, green, or blue light for displaying different colors.

It is evident that the sustain electrodes are critical to the plasma display panel. The plasma display panel will function well only when the sustain electrodes discharge normally. However, the sustain electrode defects occur from time to time during the manufacturing process. In addition, a high initial voltage of the sustain electrode would increase the operational temperature of the plasma panel display. Therefore more and more electrode pattern designs are proposed to reduce the initial voltage of the sustain electrode. As the complexity of the electrode pattern increases, electrode pattern defects will occur more easily than before.

Take the sustain electrode for example. While forming the sustain electrode, a transparent conductive layer, such as ITO or IZO, is first formed on the surface of the front substrate by a sputtering process, then the electrode pattern is defined by a photo-etching process. Since the complexity of the electrode increases as the critical dimension decreases, the electrode pattern defects will easily occur due to particles or scratches of the photo mask.

The electrode pattern defects would affect the discharge efficiency, and further deteriorate the display quality of the plasma display panel. However, since a related solution regarding this problem does not exist, most manufacturers adopt looser standards in order to increase throughput. Even so, the throughput of plasma display panel is not high enough. Therefore, how to solve the electrode pattern defects is a major topic for study.

SUMMARY OF INVENTION

It is therefore an object of the present invention to provide a method of repairing electrode pattern defects of a plasma display panel.

The present invention provides a method of repairing electrode pattern defects comprising performing an inspection process to determine electrode pattern defects of the plasma display panel, performing a first repairing process for filling a pit part of the electrode pattern, and performing a second repairing process for removing a salient part of the electrode pattern. The first repairing process fills the pit part with a conductive paste, and the second repairing process removes the salient part by means of a laser beam.

These and other objects of the present invention will be apparent to those of ordinary skill in the art after having read the following detailed description of the preferred embodiment that is illustrated in the various figures and drawings.

DETAILED DESCRIPTION

Figure 1:
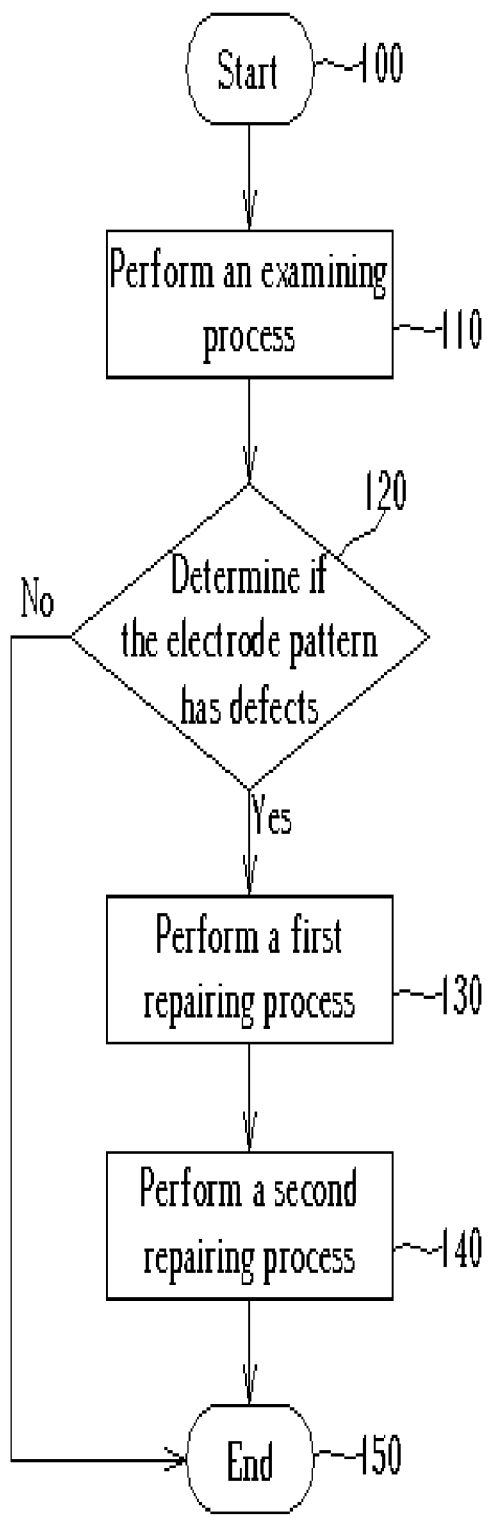
FIG. 1 is a flow chart illustrating a method of repairing electrode pattern defects according to an embodiment of the present invention.

Refer to FIG. 1, which is a flow chart illustrating a method of repairing electrode pattern defects according to an embodiment of the present invention. As shown in FIG. 1, the method of repairing electrode pattern defects comprises:

Step 100: start;

Step 110: perform an inspection process;

Step 120: determine if the electrode pattern has defects, if so go to step 130, if not go to step 150;

Step 130: perform a first repairing process to fill up the pit part of the electrode pattern;

Step 140: perform a second repairing process to remove the salient part of the electrode pattern; and Step 150: end.

As described above, an inspection process, such as an optical inspection process or an electrical inspection process, is first performed to determine if the electrode pattern has defects. If the electrode pattern has defects, then a first repairing process is performed to fill up pit parts, such as a hole, an incomplete connection, or a broken connection. A second repairing process is performed to remove salient parts. The first repairing process uses conductive paste, such as silver paste, gold paste, silver glue, ITO, or IZO. The conductive paste is applied to pit parts of the electrode pattern to recover the original pattern, such that the electrode can discharge normally. The second repairing process uses laser beams to cut off the salient part of the electrode pattern, such that normal discharge gap is kept.

Figure 2:
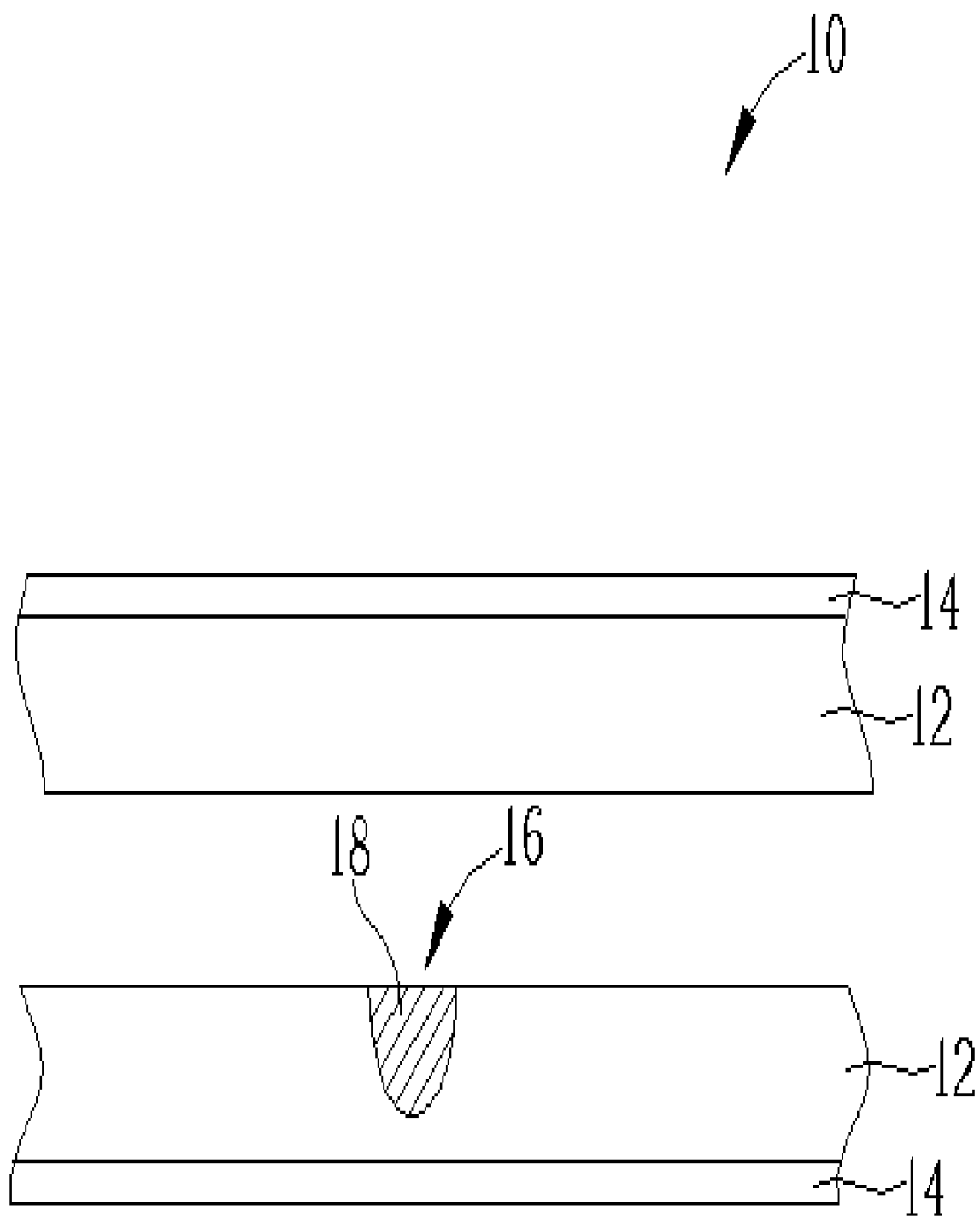
FIG. 2 is a schematic diagram of electrode pattern defects repaired according to a first embodiment of the present invention.

Refer to FIG. 2, which is a schematic diagram of electrode pattern defects repaired according to a first embodiment of the present invention. The electrode pattern 10 is exemplary a sustain electrode pattern of a plasma display panel, which comprises a pair of transparent electrodes 12, a bus electrode 14 electrically connected to each transparent electrode 12 for enhancing the conductivity of the transparent electrodes 12, and a pit part 16, such as an abnormal hole. When a pit part 16 is detected during the inspection process, a conductive paste, such as silver paste, gold paste, silver glue, ITO, or IZO is applied to the pit part 16 of the electrode pattern 10 to recover the desired electrode pattern 10. Thereby electrode discharge can occur normally.

Figure 3:
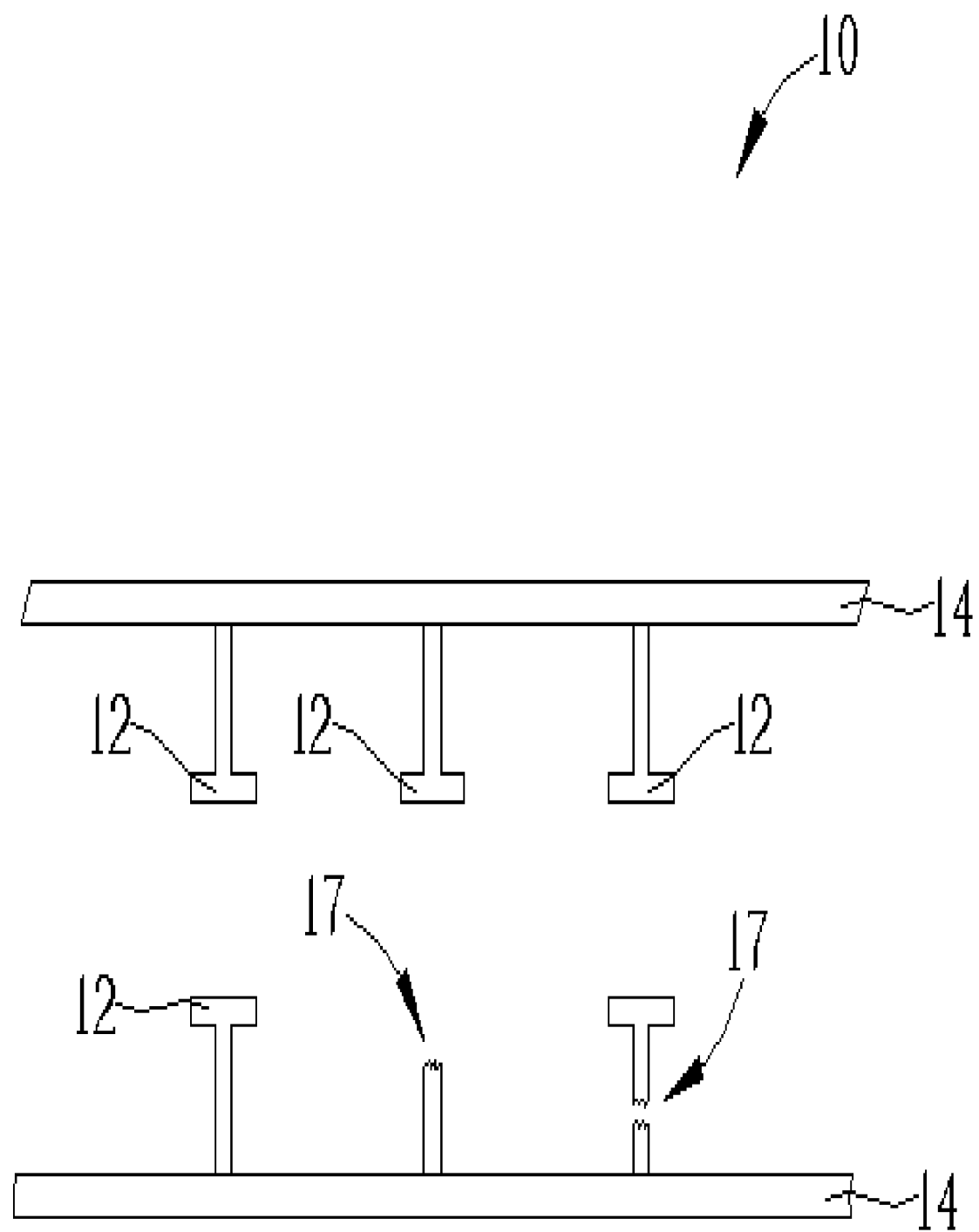
FIG. 3 is a schematic diagram of electrode pattern defects repaired according to a second embodiment of the present invention.

Refer to FIG. 3, which is a schematic diagram of electrode pattern defects repaired according to a second embodiment of the present invention. The electrode pattern 10 comprises a pair of bus electrodes 14, a plurality of T-shaped transparent electrodes 12 electrically connected to the bus electrodes 14, and a broken connection part 17 of the transparent electrode 12. In this embodiment, the shape and arrangement of the transparent electrodes 12 can be configured to stabilize the discharge of the transparent electrodes 12. However, this specific arrangement creates broken connection part 17.

When the broken connection part 17 of the transparent electrodes 12 is detected in the inspection process, a conductive paste 18 is applied to the broken connection part 17, and the electrodes can operate normally.

As described above, the electrode pattern 10 can be repaired by completely filling the conductive paste 18 into the pit part. However, some conductive pastes 18, such as gold paste or silver paste, have poor aperture ratio. Thus if the area of the pit part 16 is too large, the aperture ratio of the plasma display panel will be reduced.

Figure 4:
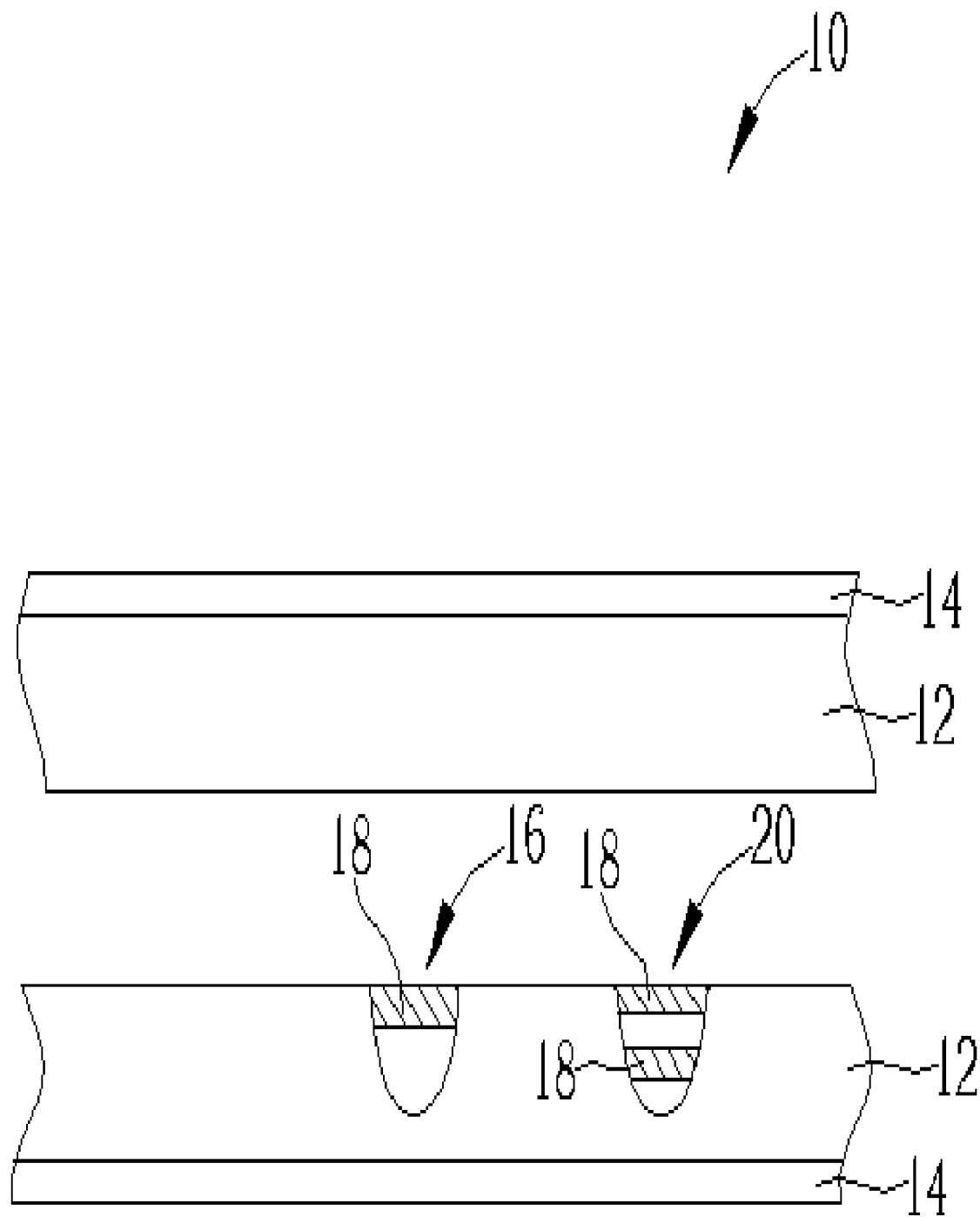
FIG. 4 is a schematic diagram of electrode pattern defects repaired according to a third embodiment of the present invention.

Refer to FIG. 4, which a schematic diagram of electrode pattern defects repaired according to a third embodiment of the present invention. The electrode pattern 10 is exemplary a sustain electrode pattern of a plasma display panel, which comprises a pair of transparent electrodes 12, a bus electrode 14 electrically connected to each transparent electrode 12 for enhancing the conductivity of the transparent electrodes 12, and a pit part 16. When the pit part 16 is detected during the inspection process, a conductive paste, such as silver paste, gold paste, silver glue, ITO, or IZO is applied to the pit part 16 of the electrode pattern 10. A desired electrode pattern 10 thereby can be recovered to obtain normal electrode discharge. In this third embodiment, the pit part 16 is partially filled up so as not to influence the aperture ratio. As shown in FIG. 4, only a slender conductive paste 18 is applied to the pit part 16, so that normal discharge function of the electrode is restored and the aperture ratio further can be maintained.

It is noteworthy that the way to fill the pit part is selective. In certain situations, the pit part, such as another pit part 20, is filled with two slender conductive pastes 18 because the area of the pit part 20 is too large. To perform partial filling, the type of the pit part is determined in the inspection process, so that the amount and shape of the conductive paste 18 can be adjusted to adequately repair the electrode pattern 10.

Figure 5:
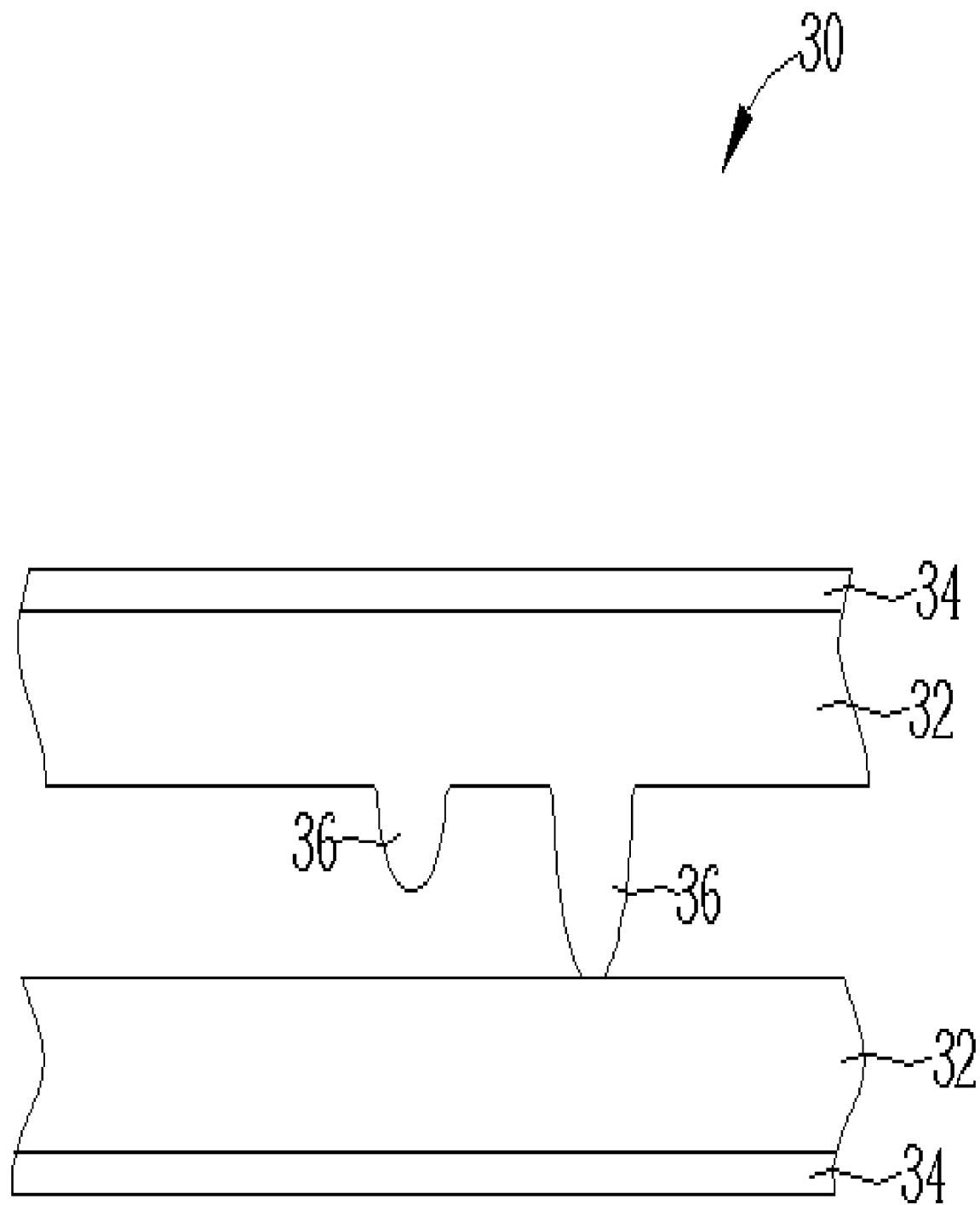
FIG. 5 is a schematic diagram of electrode pattern defects repaired according to a fourth embodiment of the present invention.

Refer to FIG. 5, which is a schematic diagram of electrode pattern defects repaired according to a fourth embodiment of the present invention. The electrode pattern 30 is exemplary a sustain electrode pattern of a plasma display panel, which comprises a pair of transparent electrodes 32, a bus electrode 34 electrically connected to each transparent electrode 32 for enhancing the conductivity of the transparent electrodes 32, and a salient part 36. The presence of salient part 36 reduces the discharge gap, and even may short-circuit the neighboring transparent electrode 32. Thus when the salient part 36 of the electrode pattern 30 is detected in the inspection process, a laser beam is utilized to cut off the salient part 30 to avoid abnormal discharge.

The method of the present invention is not limited to repair transparent electrodes of the plasma display panel. The method can also be implemented to repair other electrodes, such as bus electrodes, address electrodes, or electrodes of other displays.

Those skilled in the art will readily appreciate that numerous modifications and alterations of the device may be made without departing from the scope of the present invention. Accordingly, the above disclosure should be construed as limited only by the metes and bounds of the appended claims.

What is claimed is:

1. A method of repairing electrode pattern defects of a plasma display panel (PDP) comprising:

performing an inspection process to determine a pit defect and a salient defect of the plasma display panel;

performing a first one-step repairing process for filling the pit defect; and performing a second repairing process for removing the salient defect.

2. The method of claim 1, wherein the electrode pattern is composed of a transparent conductive material or a metal conductive material.

3. The method of claim 1, wherein the pit defect comprises a hole, an incomplete connection, or a broken connection.

4. The method of claim 1, wherein the first one-step repairing process fills the pit defect with a conductive paste.

5. The method of claim 4, wherein the conductive paste is selected from a group consisting of silver paste, ITO paste, IZO paste, gold paste, and silver glue.

6. The method of claim 4, wherein the pit defect is completely filled up in the first one-step repairing process.

7. The method of claim 4, wherein the pit defect is partially filled up in the first one-step repairing process.

8. The method of claim 1, wherein the second repairing process removes the salient defect by means of a laser beam.

9. The method of claim 1, wherein the inspection process comprises an optical inspection process or an electrical inspection process, and the electrode pattern comprises a sustain electrode pattern, a bus electrode pattern, or an address electrode pattern.

* * * * *